US012166035B2

(12) United States Patent
Hsieh et al.

(10) Patent No.: US 12,166,035 B2
(45) Date of Patent: Dec. 10, 2024

(54) FINFET WITH BOWL-SHAPED GATE ISOLATION AND METHOD

(71) Applicant: Taiwan Semiconductor Manufacturing Company, Ltd., Hsinchu (TW)

(72) Inventors: Wan-Chen Hsieh, Hsin-Chu (TW); Chung-Ting Ko, Kaohsiung (TW); Tai-Chun Huang, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 209 days.

(21) Appl. No.: 17/370,330

(22) Filed: Jul. 8, 2021

(65) Prior Publication Data

US 2023/0011218 A1 Jan. 12, 2023

(51) Int. Cl.
*H01L 27/088* (2006.01)
*H01L 21/8234* (2006.01)

(52) U.S. Cl.
CPC .. *H01L 27/0886* (2013.01); *H01L 21/823431* (2013.01); *H01L 21/823437* (2013.01); *H01L 21/823481* (2013.01)

(58) Field of Classification Search
CPC ......... H01L 27/0886; H01L 21/823431; H01L 21/823481; H01L 21/823878
See application file for complete search history.

(56) References Cited

U.S. PATENT DOCUMENTS

| | | | | |
|---|---|---|---|---|
| 8,796,666 | B1 | 8/2014 | Huang et al. | |
| 8,815,712 | B2 | 8/2014 | Wan et al. | |
| 8,963,258 | B2 | 2/2015 | Yu et al. | |
| 9,093,530 | B2 | 7/2015 | Huang et al. | |
| 9,171,929 | B2 | 10/2015 | Lee et al. | |
| 9,214,555 | B2 | 12/2015 | Oxland et al. | |
| 9,236,267 | B2 | 1/2016 | De et al. | |
| 9,520,482 | B1 | 12/2016 | Chang et al. | |
| 9,548,303 | B2 | 1/2017 | Lee et al. | |
| 9,576,814 | B2 | 2/2017 | Wu et al. | |
| 2019/0067120 | A1* | 2/2019 | Ching | H01L 21/823431 |
| 2019/0221431 | A1* | 7/2019 | Hsieh | H01L 29/785 |
| 2019/0229120 | A1* | 7/2019 | Ching | H01L 21/823481 |
| 2019/0378903 | A1* | 12/2019 | Jeon | H01L 27/088 |
| 2020/0006354 | A1* | 1/2020 | Wen | H01L 21/823821 |

* cited by examiner

*Primary Examiner* — Tuan A Hoang
(74) *Attorney, Agent, or Firm* — McClure, Qualey & Rodack, LLP

(57) ABSTRACT

Structures and formation methods of a semiconductor device structure are provided. The semiconductor device structure includes an isolation structure formed over a semiconductor substrate. A first fin structure and a second fin structure extend from the semiconductor substrate and protrude above the isolation structure. A first gate structure is formed across the first fin structure and a second gate structure is formed across the second fin structure. A gate isolation structure is formed between the first fin structure and the second fin structure and separates the first gate structure from the second gate structure. The gate isolation structure includes a bowl-shaped insulating layer that has a first convex sidewall surface adjacent to the first gate structure and a second convex sidewall surface adjacent to the second gate structure.

20 Claims, 16 Drawing Sheets

FINFET WITH BOWL-SHAPED GATE ISOLATION AND METHOD

BACKGROUND

The semiconductor industry has experienced rapid growth and demands for highly integrated semiconductor devices are increasing. Technological advances in integrated circuit (IC) design and materials have produced generations of ICs. Each generation has smaller and more complex circuits than previous generations.

In the course of IC evolution, functional density (i.e., the number of interconnected devices per chip area) has generally increased while geometric size (i.e., the smallest component (or line) that can be created using a fabrication process) has decreased. However, challenges from both fabrication and design issues have resulted in the development of three-dimensional designs, such as the fin field effect transistor (FinFET).

Although existing FinFETs and methods of fabricating those transistors have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A to 2H show cross-sectional views of various stages of a semiconductor device structure, in accordance with some embodiments, in which FIG. 2A is a schematic cross-sectional view showing the semiconductor device structure taken along the line 2-2' in FIG. 1H.

DETAILED DESCRIPTION

Figure 1A:
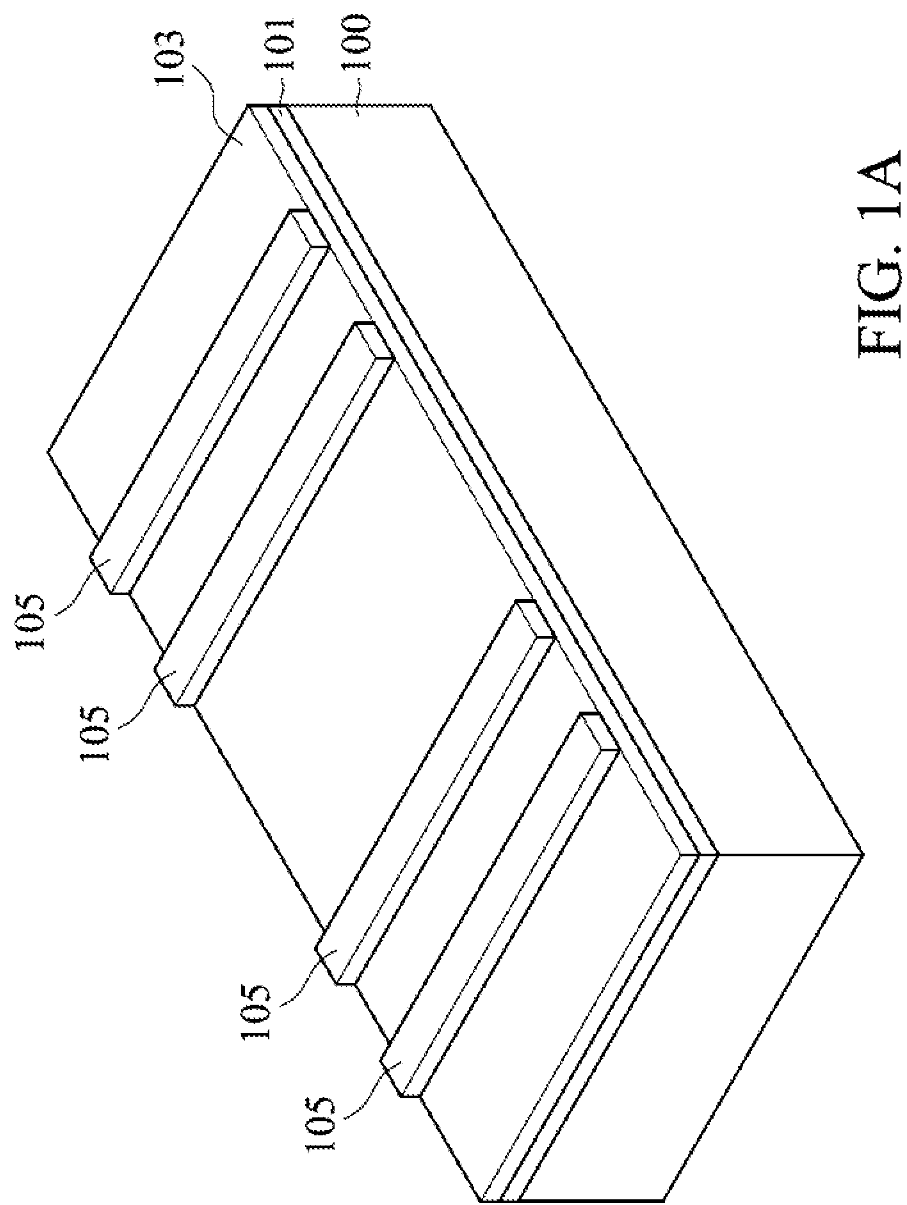
FIGS. 1A to 1H show perspective representations of various stages of forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG. s. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of a semiconductor device structure and a method of forming a semiconductor device structure are provided. FIGS. 1A to 1H show perspective representations of various stages of forming a fin field effect transistor (FinFET) structure, in accordance with some embodiments of the disclosure. In some embodiments, a substrate 100 is provided, as shown in FIG. 1A. The substrate 100 may be doped or undoped, or an active layer of a semiconductor-on-insulator (SOI) substrate. Alternatively or additionally, the substrate 100 may include other elementary semiconductor materials such as germanium. In some embodiments, the substrate 100 is made of a compound semiconductor such as silicon carbide, gallium arsenic, indium arsenide, or indium phosphide. In some embodiments, the substrate 100 is made of an alloy semiconductor such as silicon germanium, silicon germanium carbide, gallium arsenic phosphide, or gallium indium phosphide. In some embodiments, the substrate 100 includes an epitaxial layer. For example, the substrate 100 has an epitaxial layer overlying a bulk semiconductor. Other substrates, such as multilayered or gradient substrates, may also be used.

In some embodiments, a mask structure is formed over the substrate 100. The mask structure includes a first masking layer 101 and a second masking layer 103 that are successively stacked over the substrate 100 for the subsequent patterning process, in accordance with some embodiments. For example, the first masking layer 101 may be used as an etch stop layer when the second masking layer 103 is patterned. The first masking layer 101 may also be used as an adhesion layer that is formed between the substrate 100 and the second masking layer 103.

In some embodiments, the first masking layer 101 is made of silicon oxide and is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the second masking layer 103 is made of silicon oxide, silicon nitride, silicon oxynitride, or another applicable material. In some other embodiments, more than one second masking layer 103 is formed over the first masking layer 101. In some embodiments, the second masking layer 103 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the mask structure is formed, a patterned resist layer 105 is formed over the second masking layer 103 for subsequent definition of one or more fin structures in the substrate 100. In some embodiments, the patterned resist layer 105 is formed by a photolithography process. The photolithography process may include photoresist coating (e.g., spin-on coating), soft baking, mask aligning, exposure, post-exposure baking, developing the photoresist, rinsing and drying (e.g., hard baking).

Figure 1B:
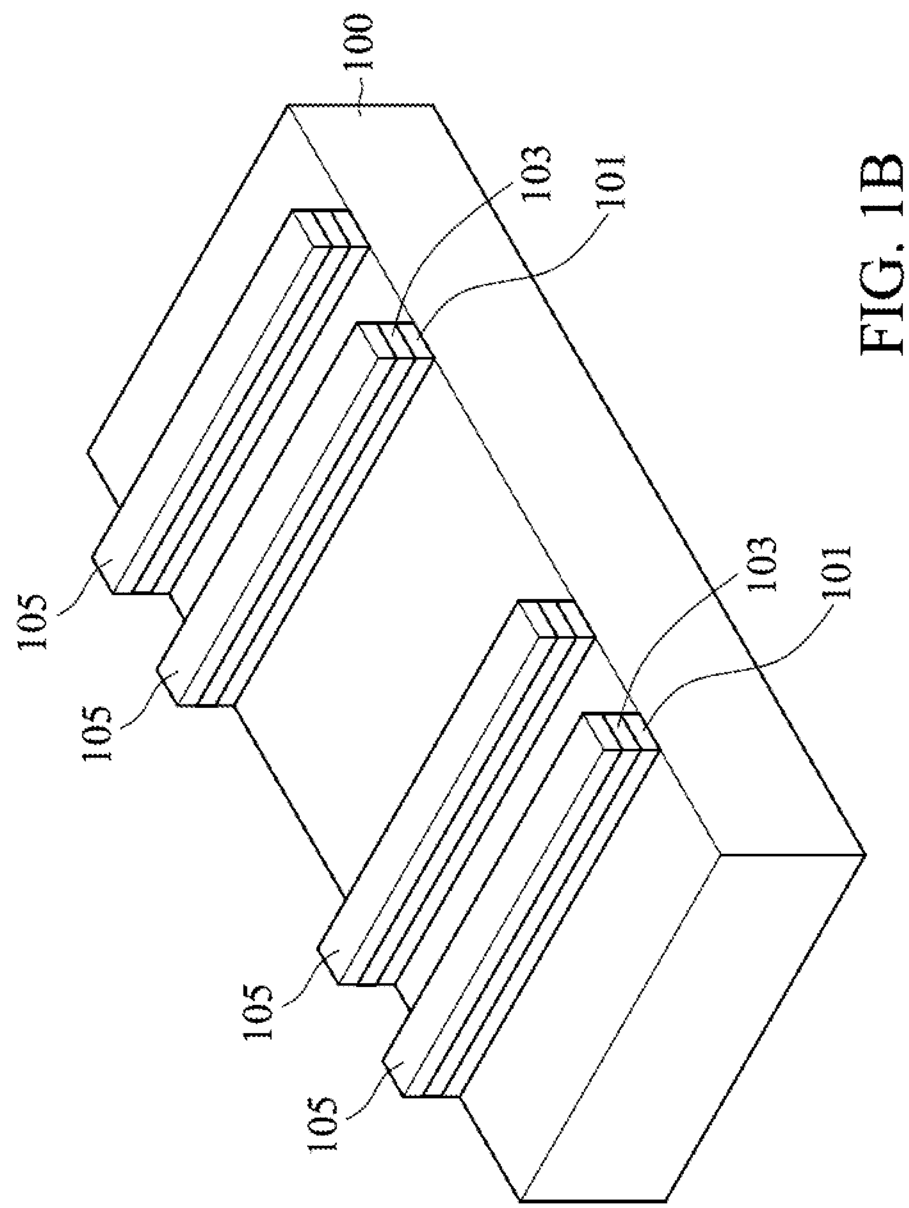

In some embodiments, the first masking layer 101 and the second masking layer 103 of the mask structure are patterned by using the patterned resist layer 105 as an etch mask, as shown in FIG. 1B. After the first masking layer 101 and the overlying second masking layer 103 are patterned, a patterned first masking layer 101 and a patterned second masking layer 103 are formed over the substrate 100, so as to expose portions of the substrate 100.

Figure 1C:
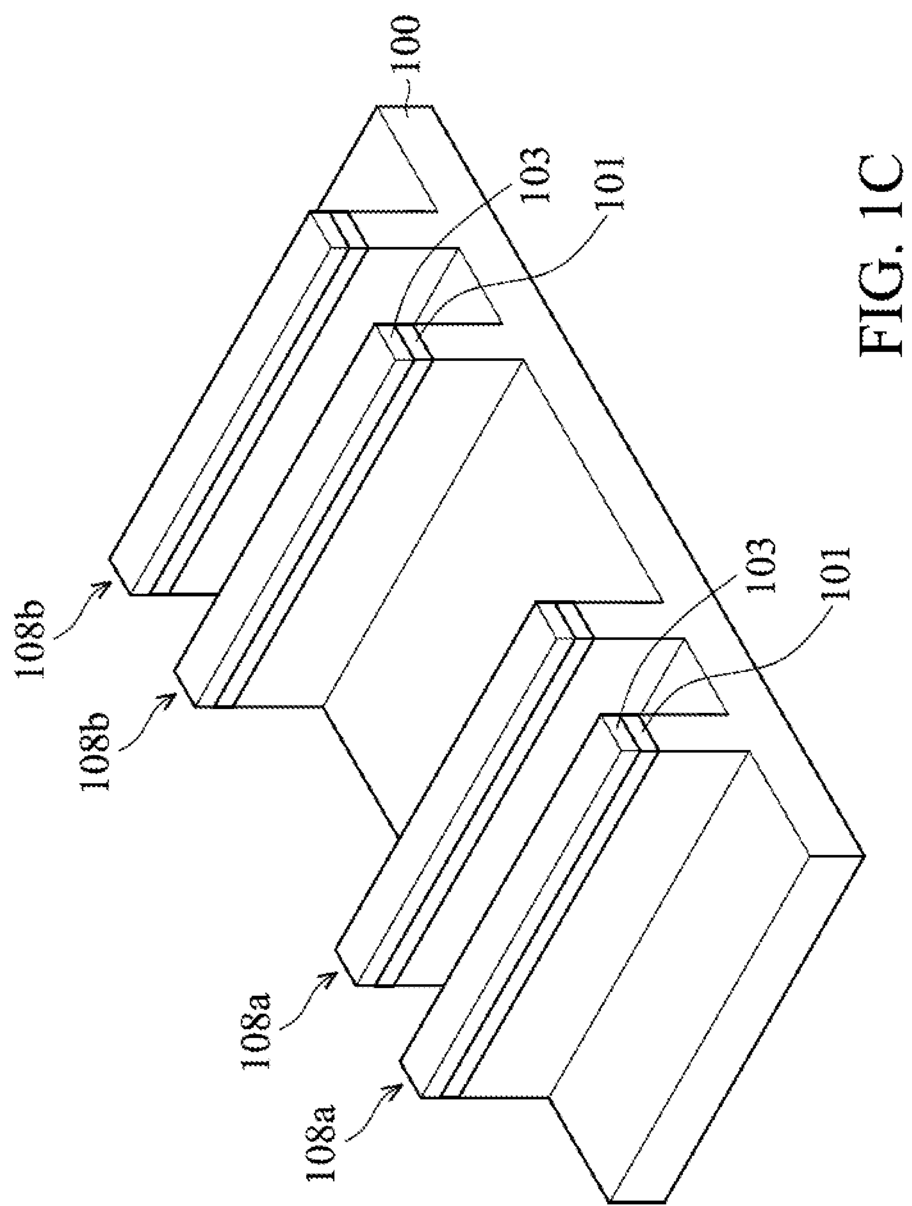

In some embodiments, the patterned resist layer 105 is removed after the patterned first masking layer 101 and the patterned second masking layer 103 are formed and the portions of the substrate 100 are exposed, as shown in FIG. 1C. Afterwards, the exposed portions of the substrate 100 are partially removed by an etching process using the patterned second masking layer 103 and the patterned first masking layer 101 as an etch mask. As a result, fin structures and trenches in the substrate 100 are formed. In order to simplify the diagram, two fin structures 108*a* and two fin structures 108*b* that protrude from the substrate 100 are depicted as an example.

In some embodiments, the etching process for formation of fin structures 108*a* and 108*b* is a dry etching process or a wet etching process. For example, the substrate 100 is etched by a dry etching process, such as a reactive ion etching (RIE), neutral beam etching (NBE), the like, or a combination thereof. The etching process may be a time-controlled process, and continue until the fin structures 108*a* and 108*b* are formed and reach a predetermined height. A person of ordinary skill in the art will readily understand other methods of forming the fin structures, which are contemplated within the scope of some embodiments.

Figure 1D:
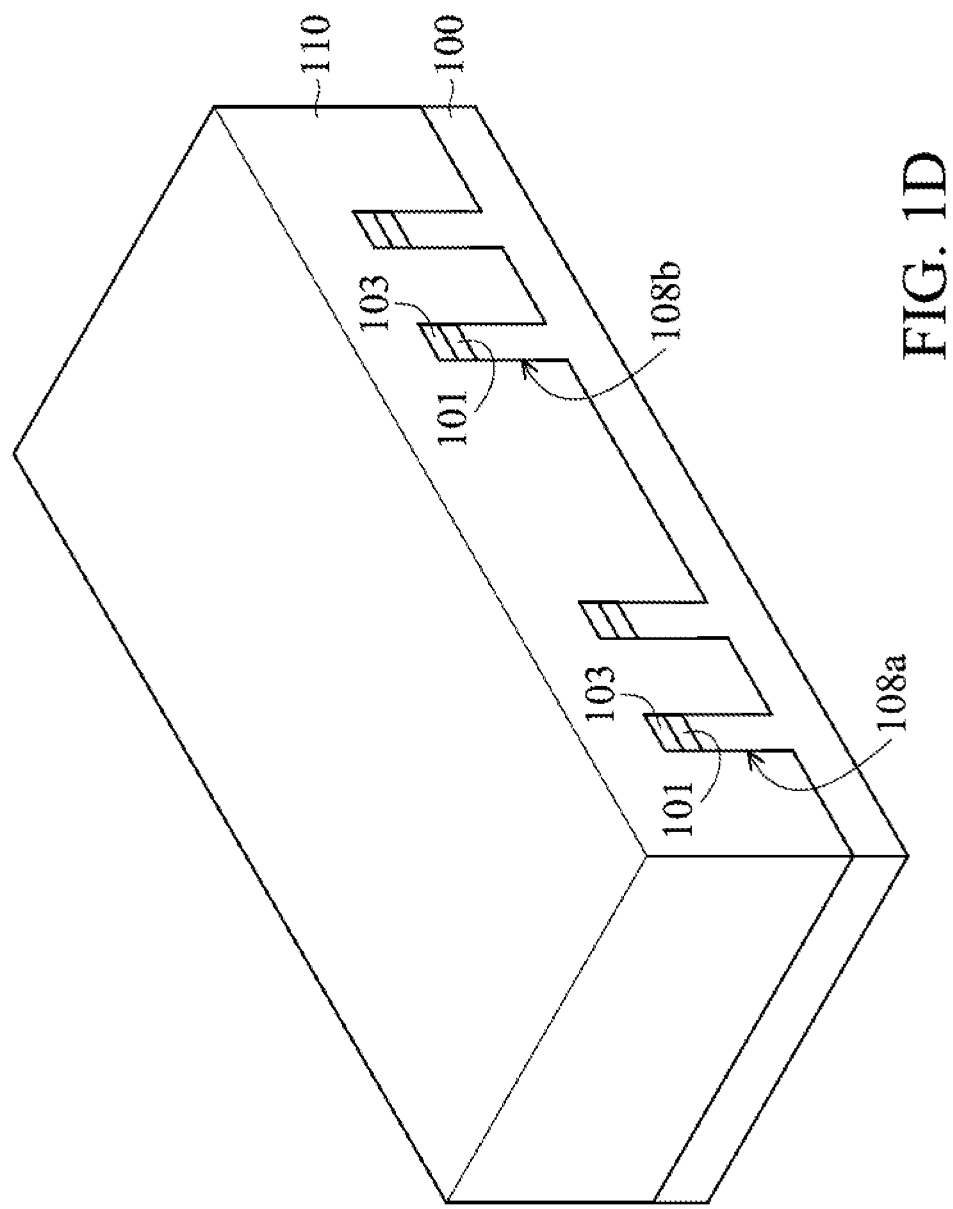

Afterwards, an insulating layer 110 is formed over the substrate 100 to cover the fin structures 108*a* and 108*b,* as shown in FIG. 1D in accordance with some embodiments. In some embodiments, the insulating layer 110 is made of silicon oxide, fluoride-doped silicate glass (FSG), a low-k dielectric material, and/or another suitable dielectric material or another low-k dielectric material. The insulating layer 110 may be deposited by a chemical vapor deposition (CVD) process, a flowable CVD (FCVD) process, a spin-on-glass process, or another applicable process.

In some other embodiments, before the insulating layer 110 is formed, one or more insulating liners (not shown) are formed on the sidewalls of the fin structures 108*a* and 108*b* and the bottom of the trenches in the substrate 100. The insulating liner(s) may be formed of silicon oxide, silicon nitride, silicon oxynitride, silicon carbide (SiC), or a combination thereof. The liner(s) may be deposited by a chemical vapor deposition (CVD) process or another applicable process.

Afterwards, the insulating layer 110 is recessed, in accordance with some embodiments. For example, the insulating layer 110 over the top surface of the patterned second masking layer 103 may be etched back by a chemical mechanical polishing (CMP) process. After the top surface of the patterned second masking layer 103 is exposed, the patterned second masking layer 103 and the patterned first masking layer 101 are removed by one or more etching processes, so as to expose the top surfaces of the fin structures 108*a* and 108*b,* in accordance with some embodiments. For example, the patterned second masking layer 103 and the patterned first masking layer 101 may be removed by a dry etching process, a wet etching process, or a combination thereof.

Figure 1E:
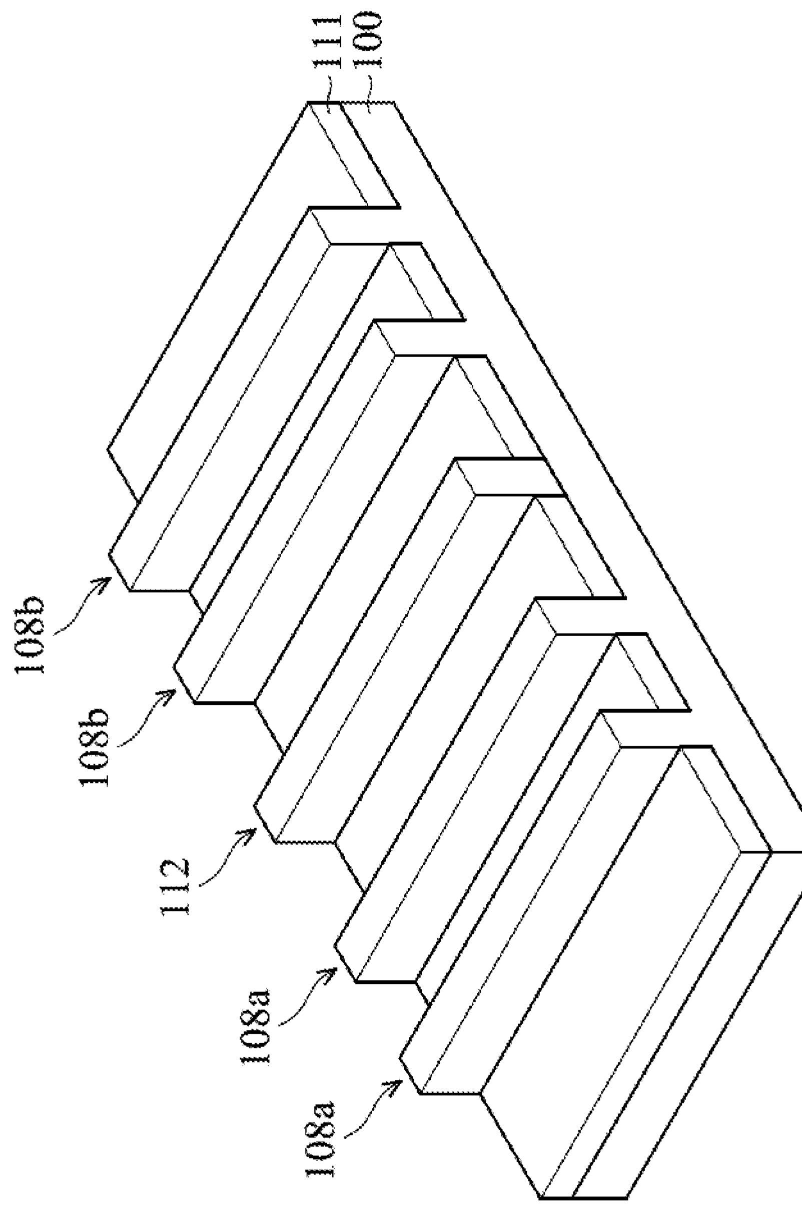

Afterwards, the exposed insulating layer 110 is further recessed to form isolation structures 111, as shown in FIG. 1E in accordance with some embodiments. In some embodiments, the isolation structure 111 includes the remaining insulating layer 110 and the insulating liner(s) (not shown) surrounding the remaining insulating layer 110. The isolation structures 111 may be shallow trench isolation (STI) structures surrounding the fin structures 108*a* and 108*b*. Portions of the fin structures 108*a* and 108*b* are embedded in the isolation structures 111, so that the upper portions of the fin structures 108*a* and 108*b* protrude from the isolation structures 111.

After the isolation structures 111 are formed, an insulating layer 112 is formed over the substrate 100 and between one of the fin structures 108*a* and one of the fin structures 108*b,* as shown in FIG. 1E, in accordance with some embodiments. In some embodiments, the insulating layer 112 passes through the isolation structure 111 and in direct contact with the top surface of the substrate 100, as shown in FIG. 1E. In some other embodiments, the insulating layer 112 is formed over the substrate 100 without passing through the isolation structure 111, so that the insulating layer 112 is in contact with the top surface of the isolation structure 111. The insulating layer 112 may have a strip shape that is similar to the shape of the fin structures 108*a* and 108*b*. Therefore, the insulating layer 112 may be referred to as an insulating fin structure or a dummy fin structure. The insulating fin structure 112 is spaced apart from the fin structures 108*a* and 108*b* and extends along a direction that is substantially parallel to the extending direction of the fin structures 108*a* and 108*b*.

In some embodiments, the insulating fin structure 112 serves as a portion of an insulating gate isolation structure and is made of a nitride-based material, such as silicon carbon nitride, silicon nitride, silicon oxynitride, or the like. In some embodiments, the insulating fin structure 112 is made of a high-k dielectric material such as metal oxide in accordance with some embodiments. Examples of high-k dielectric materials include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the insulating fin structure 112 is formed by chemical vapor deposition (CVD), physical vapor deposition, (PVD), or another applicable process.

Figure 1F:
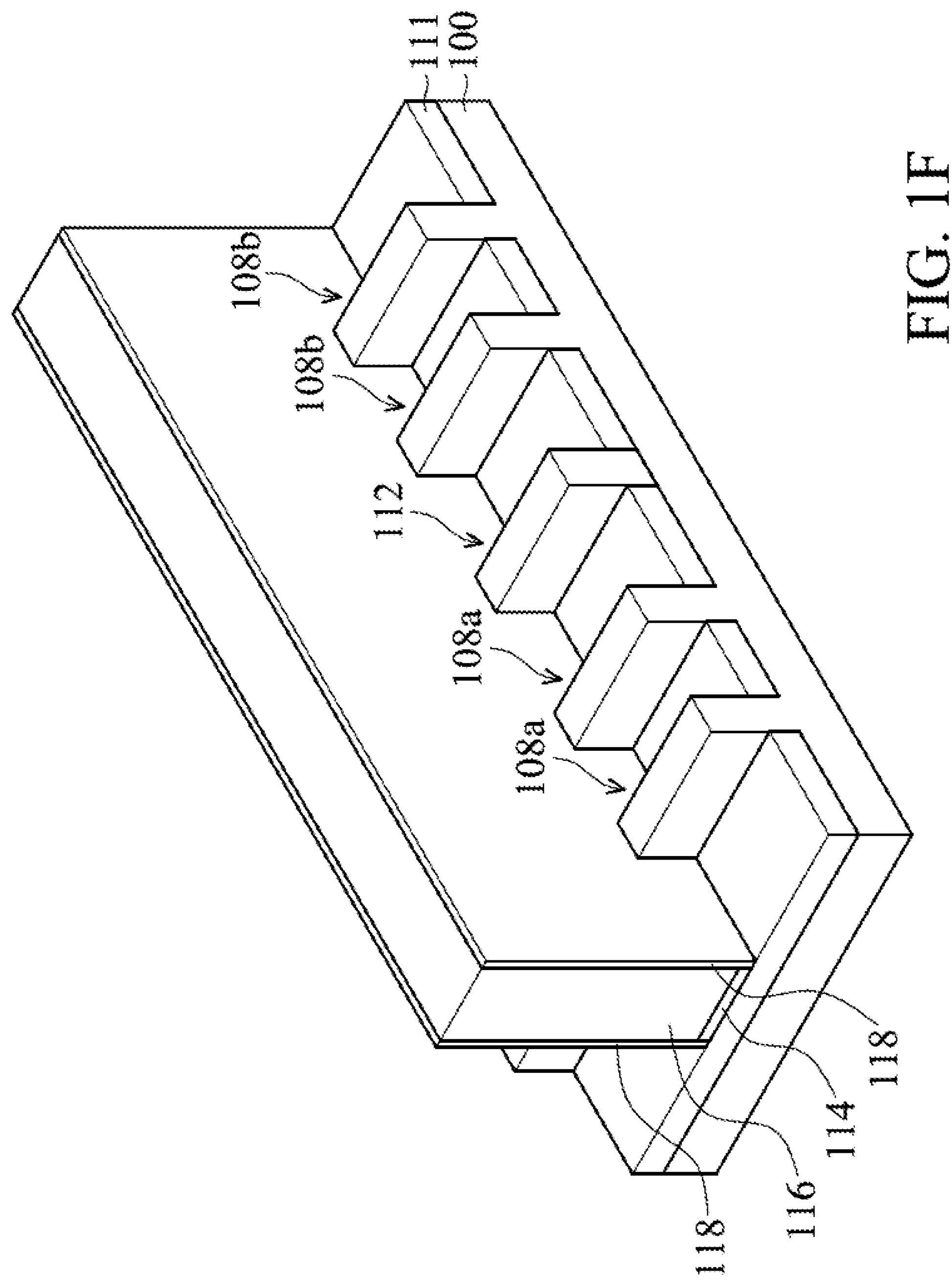

Afterwards, a dummy gate structure is formed over the isolation structures 111 and across the fin structures 108*a* and 108*b* and the insulating fin structure 112 (i.e., the dummy fin structure), as shown in FIG. 1F in accordance with some embodiments. In some embodiments, the dummy gate structure includes an optional dummy gate dielectric layer 114 and a dummy gate electrode layer 116 over the dummy gate dielectric layer 114. The dummy gate dielectric layer 114 may be made of a high-k dielectric material such as metal oxide. Examples of high-k dielectric materials may include hafnium oxide ($HfO_2$), hafnium silicon oxide (HfSiO), hafnium tantalum oxide (HMO), hafnium titanium oxide (HfTiO), hafnium zirconium oxide (HfZrO), zirconium oxide, titanium oxide, aluminum oxide, or other applicable dielectric materials. The dummy gate dielectric layer 114 may be formed by chemical vapor deposition (CVD), physical vapor deposition, (PVD), atomic layer deposition (ALD), or other applicable processes.

After the dummy gate dielectric layer 114 is formed, the dummy gate electrode layer 116 is formed over dummy gate dielectric layer 114. For example, the dummy gate electrode layer 116 may be made of polysilicon. Afterwards, the dummy gate dielectric layer 114 and the dummy gate electrode layer 116 are patterned to form the dummy gate structure over and across the fin structures 108*a* and 108*b* and the insulating fin structure 112, in accordance with some embodiments.

After the dummy gate structure is formed, two opposing gate spacer layers 118 are formed on opposite sidewall surfaces of the dummy gate structure. The gate spacer layers 118 may be a single layer or multiple layers. In some embodiments, the gate spacer layers 118 are made of silicon nitride, silicon oxide, silicon carbide, silicon oxynitride, or other applicable materials. In some embodiments, the gate spacer layers 118 are formed by chemical vapor deposition (CVD), physical vapor deposition, (PVD), atomic layer deposition (ALD), or other applicable processes.

Figure 1G:
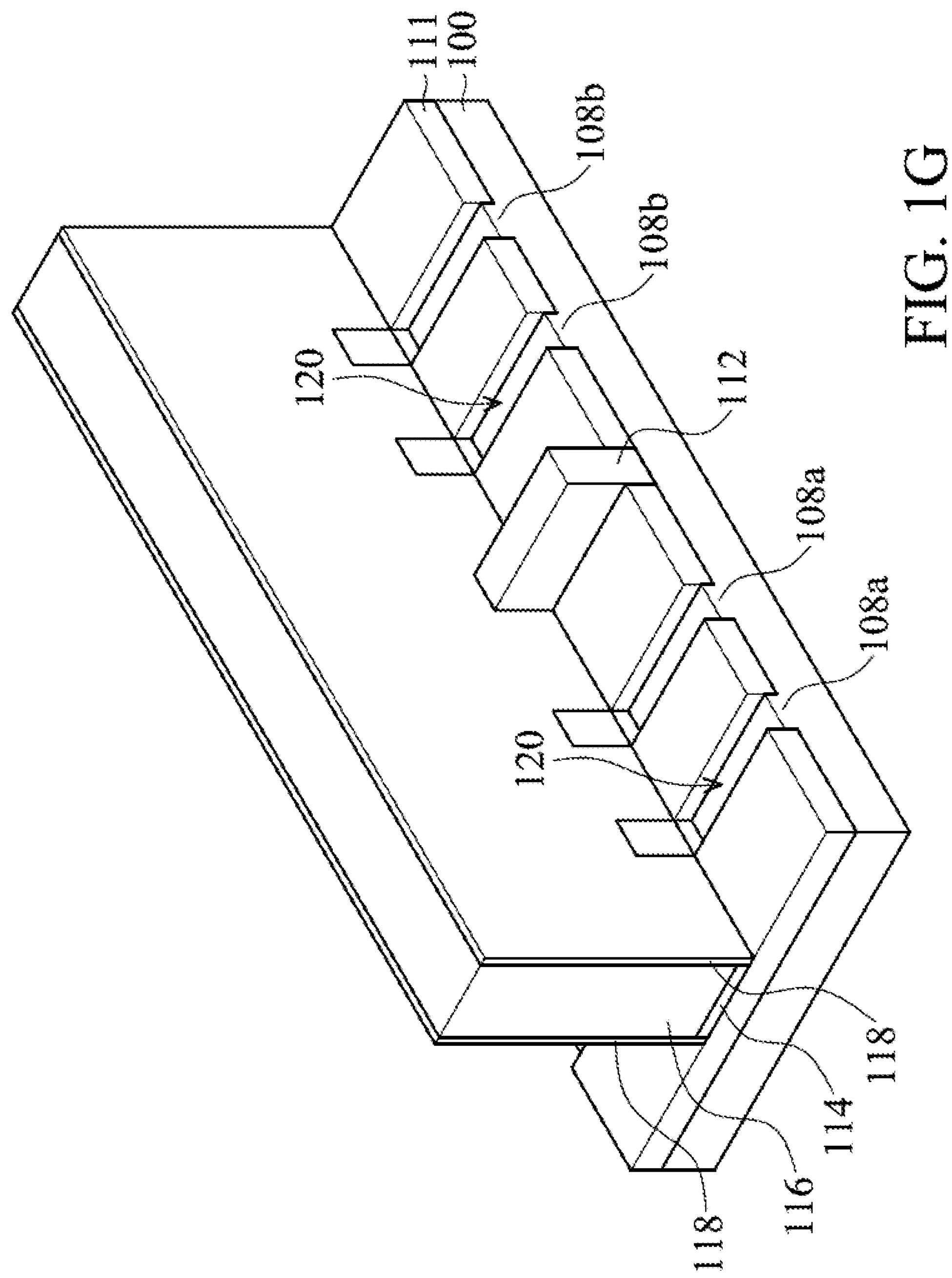

In some embodiments, openings 120 are formed in each fin structure 108*a* and each fin structure 108*b* by a fin recess process after the formation of the gate spacer layers 118, as shown in FIG. 1G in accordance with some embodiments. Openings 120 are also formed on opposing sidewall surfaces of the dummy gate structure. In some embodiments, the fin recess process is a dry etching process or a wet etching process. The bottom surfaces of the formed openings 120 are lower than the top surfaces of the isolation structures 111.

Figure 1H:
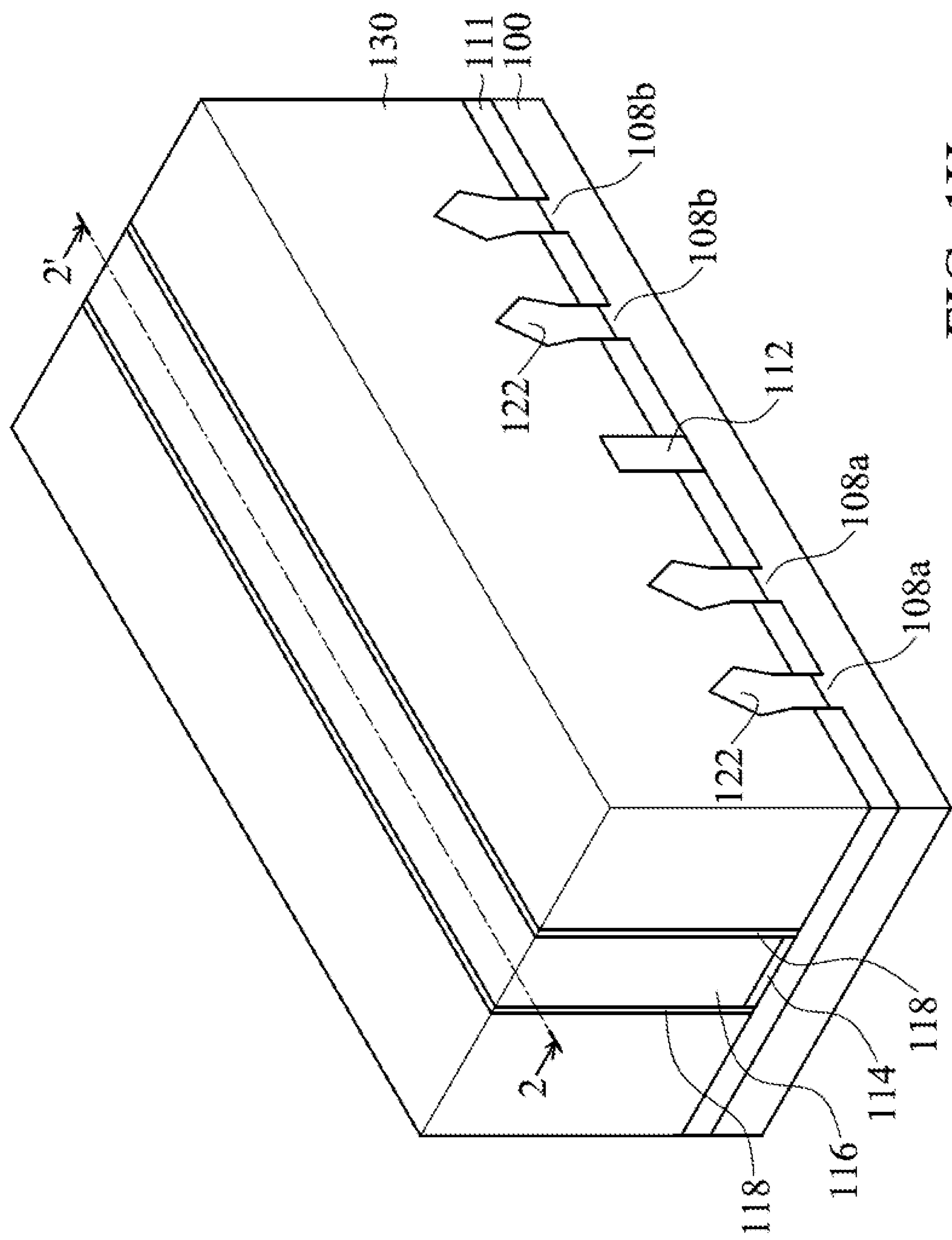

Afterwards, source and drain features 122 are formed in the openings 120 (which is indicated by FIG. 1G) of the fin structures 108*a* and 108*b* and protrude above the isolation structures 111, as shown in FIG. 1H in accordance with some embodiments. More specifically, portions of the fin structure 108*a* adjacent to the dummy gate structure and portions of the fin structure 108*b* adjacent to the dummy gate structure are recessed to form openings 120. Afterwards, for example, an epitaxial material may be grown in each opening 120 by an epitaxial growth process to form the source and drain features 122. As a result, the source and drain features 122 are formed over the fin structures 108*a* and 108*b* and on opposing sidewall surfaces of the dummy gate structure. In some embodiments, the source and drain features 122 include Ge, SiGe, InAs, InGaAs, InSb, GaAs, GaSb, InAlP, InP, or the like.

After the source and drain features 122 are formed, an insulating layer 130 (e.g., an inter-layer dielectric (ILD) layer) is formed over the substrate 100 to cover the dummy gate structure the source and drain features 122, in accordance with some embodiments. For example, the insulating layer 130 may include multilayers made of multiple dielectric materials, such as silicon oxide, silicon nitride, silicon oxynitride, tetraethoxysilane (TEOS) oxide, phosphosilicate glass (PSG), borophosphosilicate glass (BPSG), low-k dielectric material, and/or other applicable dielectric materials. Examples of low-k dielectric materials include, fluorinated silica glass (FSG), carbon doped silicon oxide, amorphous fluorinated carbon, parylene, bis-benzocyclobutenes (BCB), or polyimide. In some embodiments, the insulating layer 130 is formed by chemical vapor deposition (CVD), physical vapor deposition, (PVD), atomic layer deposition (ALD), spin-on coating, or another applicable process.

In some other embodiments, a contact etch stop layer (not shown) is formed between the substrate 100 and the insulating layer 130. For example, the contact etch stop layer may be made of silicon nitride, silicon oxynitride, and/or other applicable materials, in accordance with some embodiments. The contact etch stop layer may be formed by plasma enhanced chemical vapor deposition (PECVD), low-pressure chemical vapor deposition (LPCVD), atomic layer deposition (ALD), or other applicable processes.

Afterwards, a planarization process is performed on the insulating layer 130 until the top surface of the dummy gate structure is exposed, as shown in FIG. 1H in accordance with some embodiments. In some embodiments, the insulating layer 130 is planarized by a polishing process, such as a chemical mechanical polishing (CMP) process.

Figure 2A:
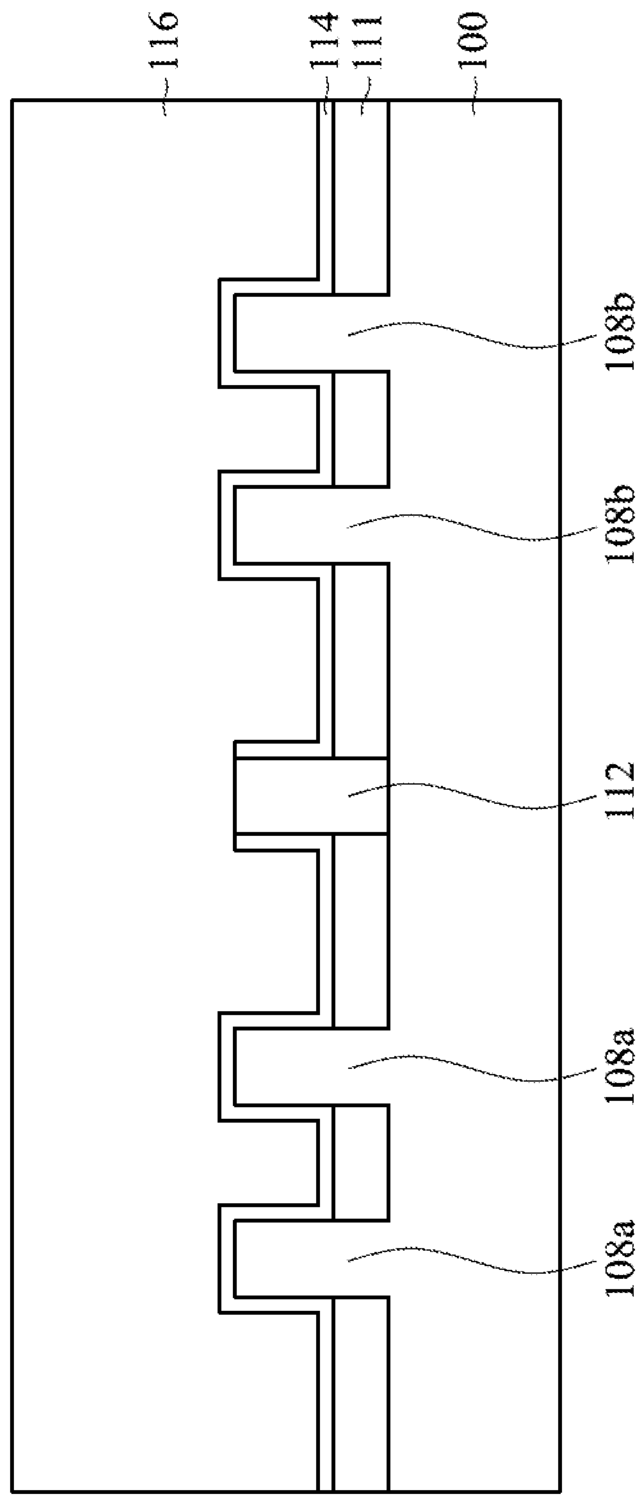

Refer to FIGS. 2A to 2H, which show cross-sectional views of various stages of a semiconductor device structure, in accordance with some embodiments, in which FIG. 2A is a schematic cross-sectional view showing the semiconductor device structure taken along the line 2-2' in FIG. 1H. A dummy structure is formed over the substrate 100 to cover the fin structures 108*a* and 108*b* and the insulating fin structure 112, as shown in FIGS. 1F to 1H and 2A. More specifically, a portion of the dummy gate dielectric layer 114 that covers the top surface of the insulating fin structure 112 is removed prior to the formation of the dummy gate electrode layer 116, so that the formed dummy gate electrode layer 116 is in direct contact with the top surface of the insulating fin structure 112, as shown in FIG. 2A.

Figure 2B:
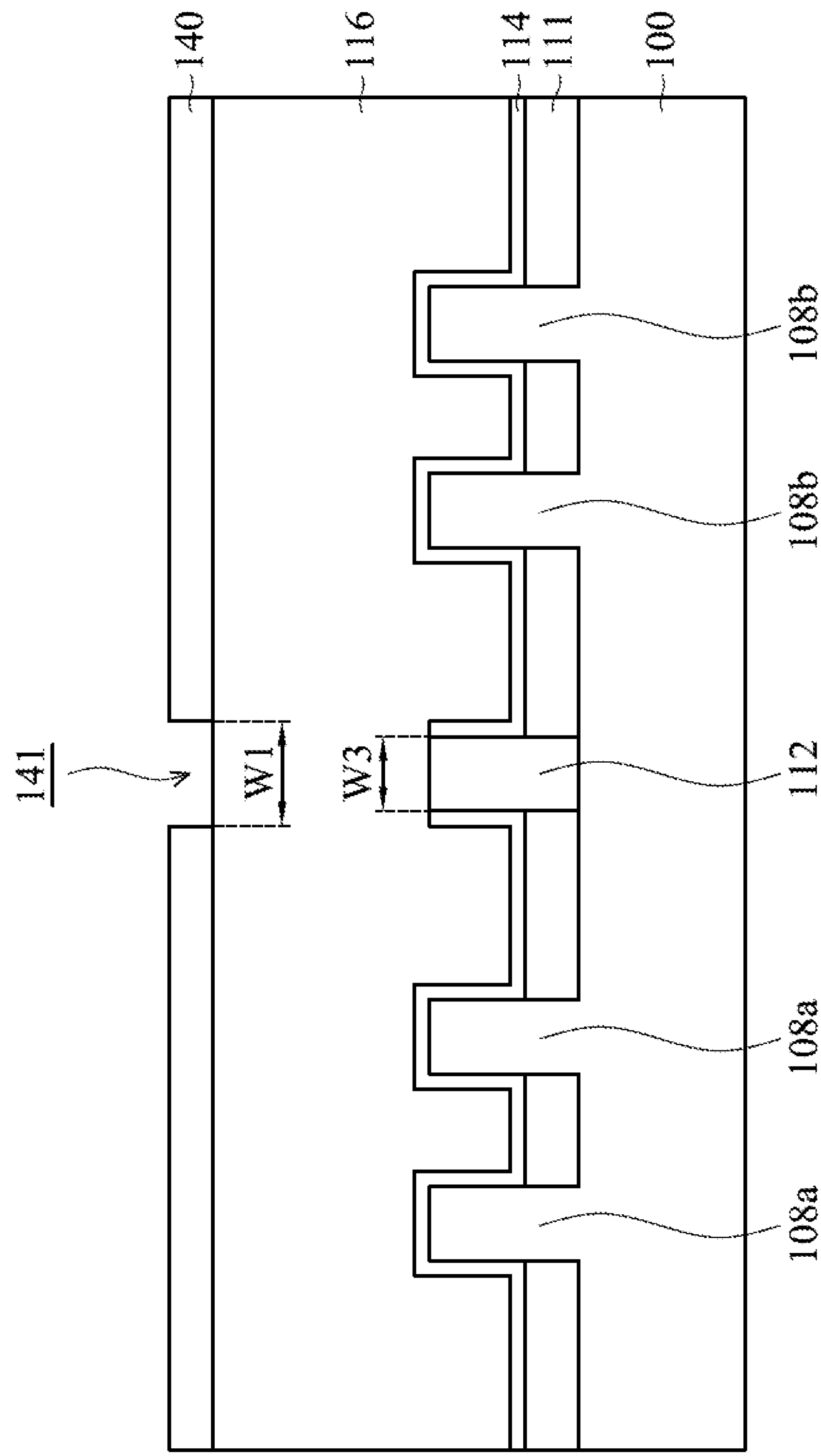
Figure 2C:
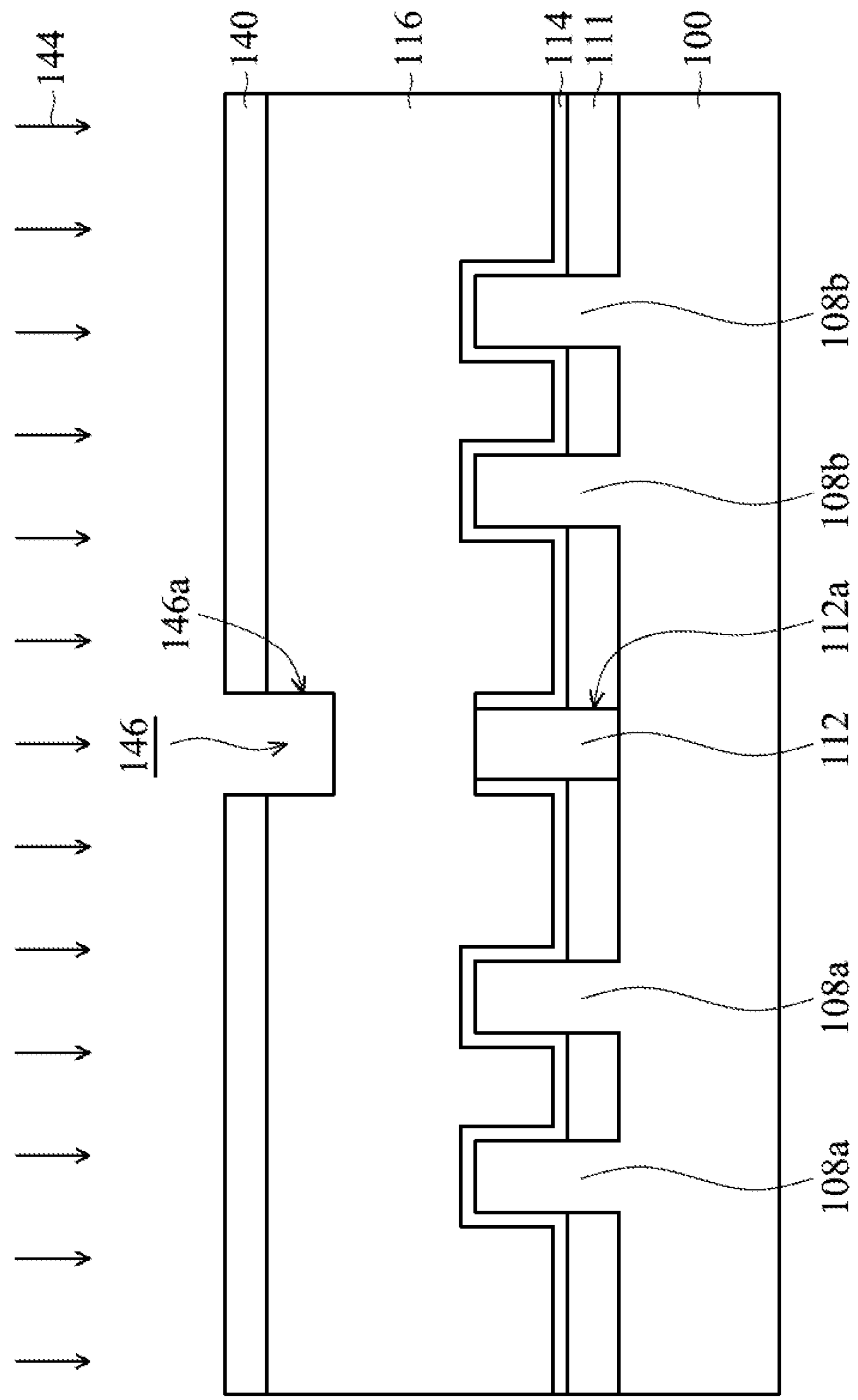
Figure 2D:
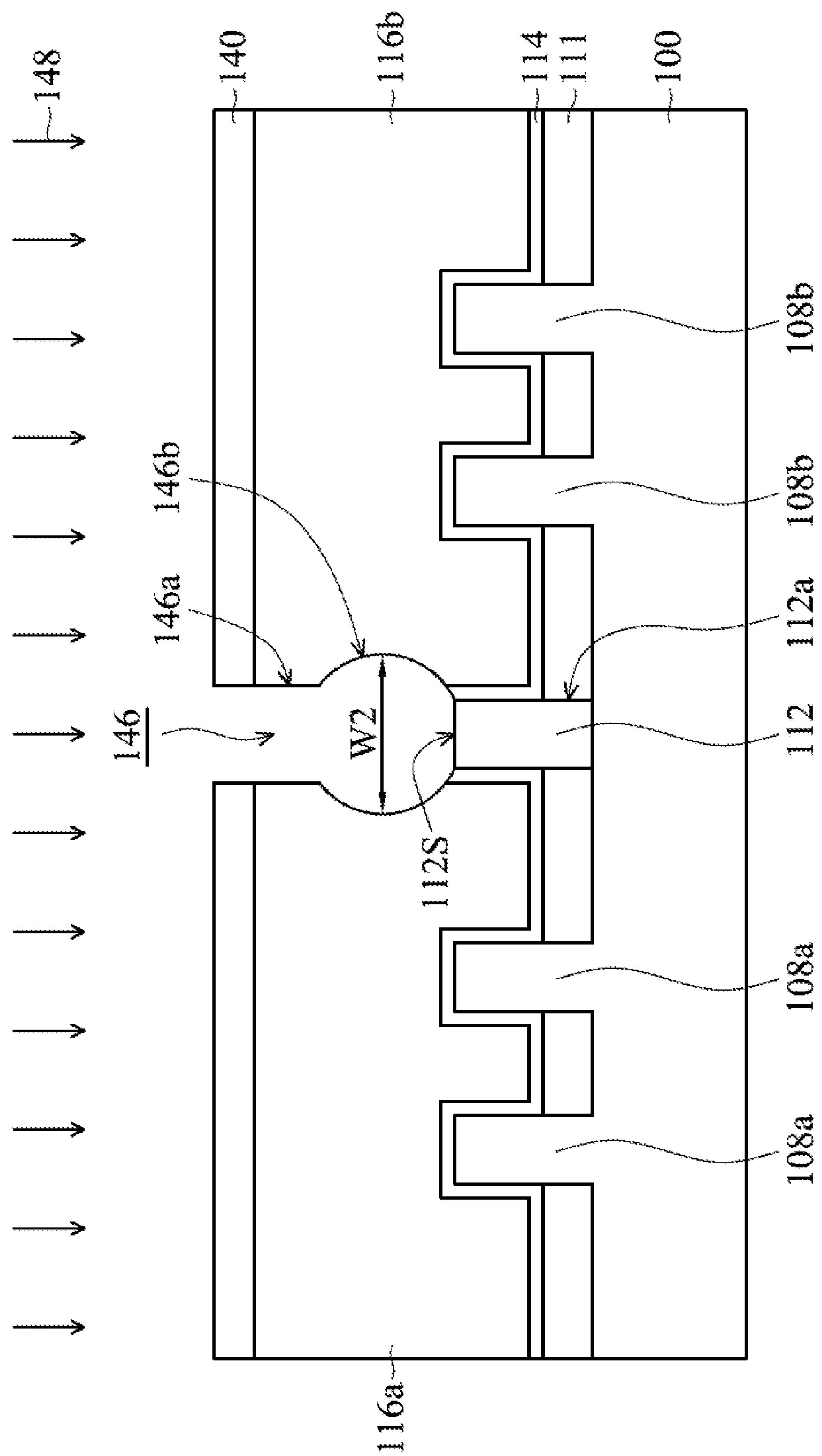
Figure 2E:
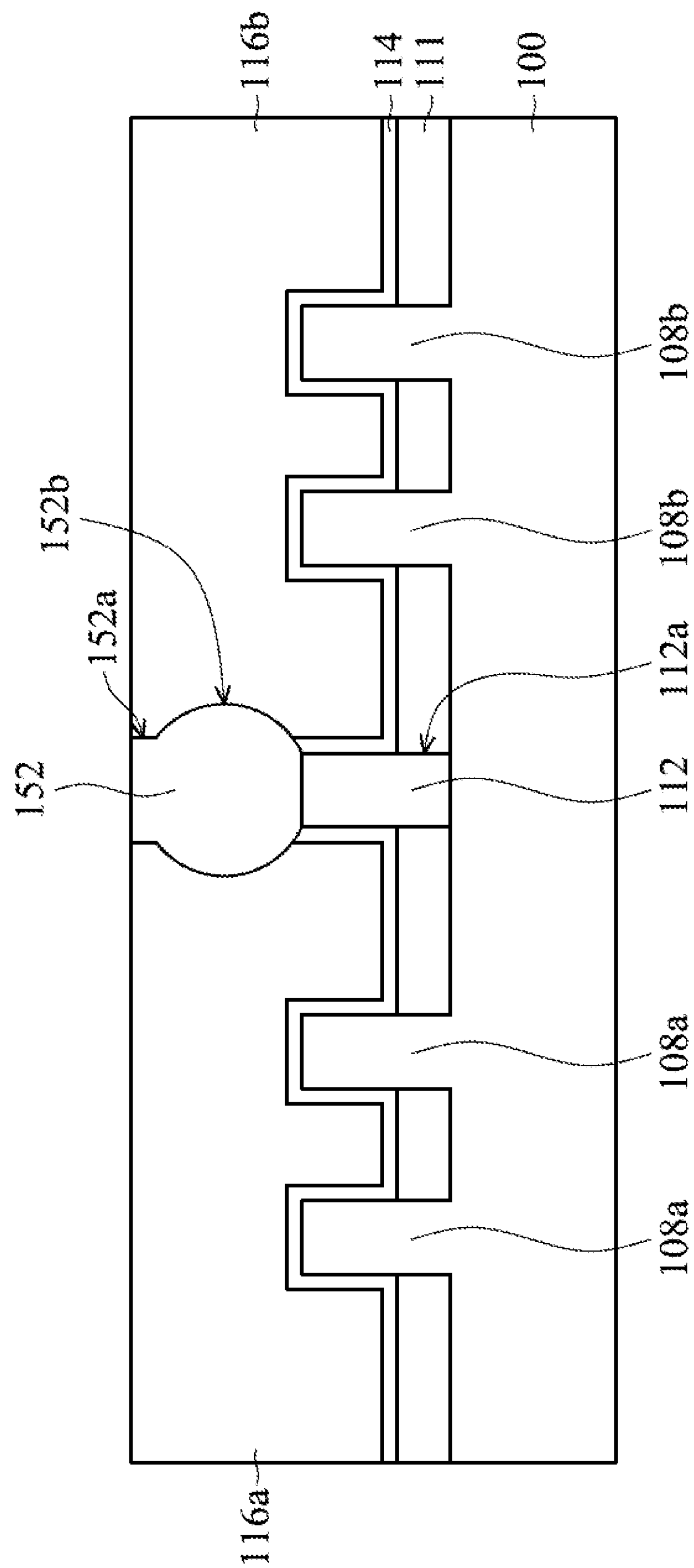
Figure 2F:
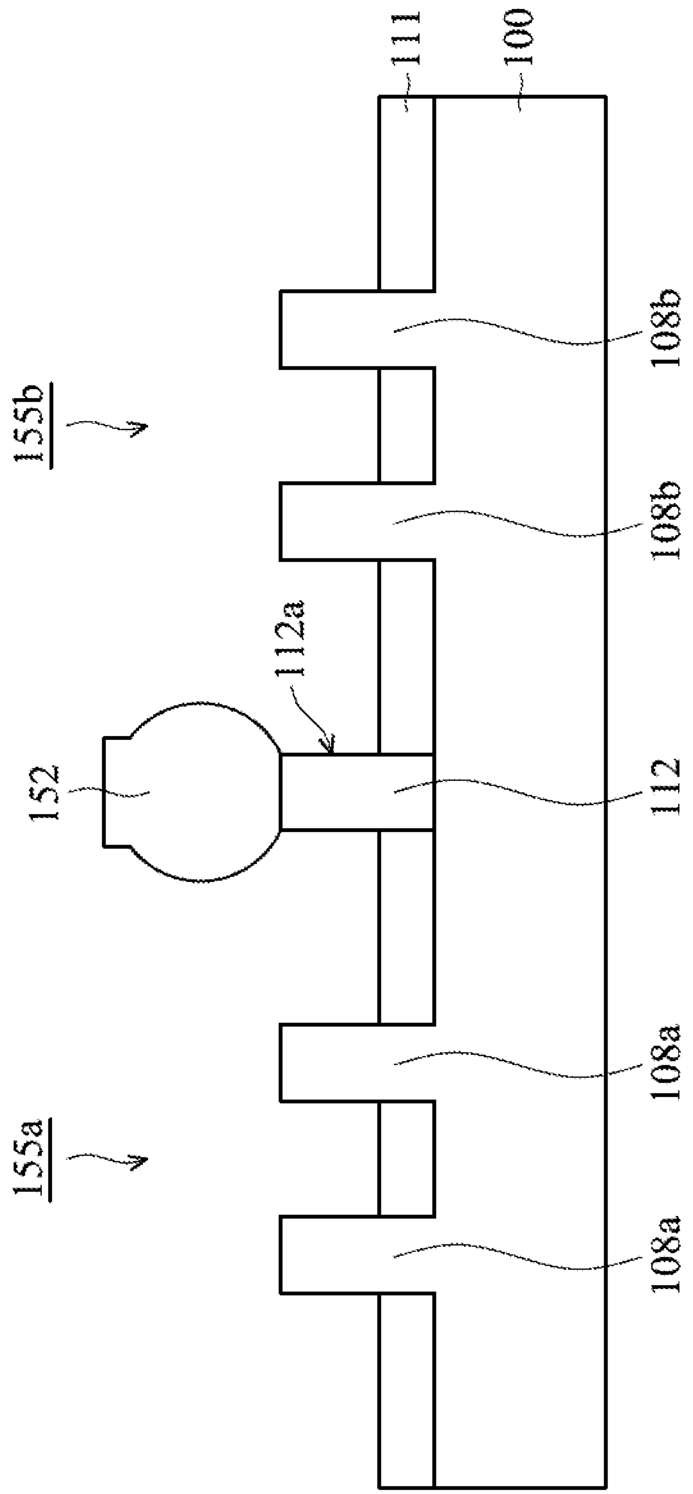
Figure 2G:
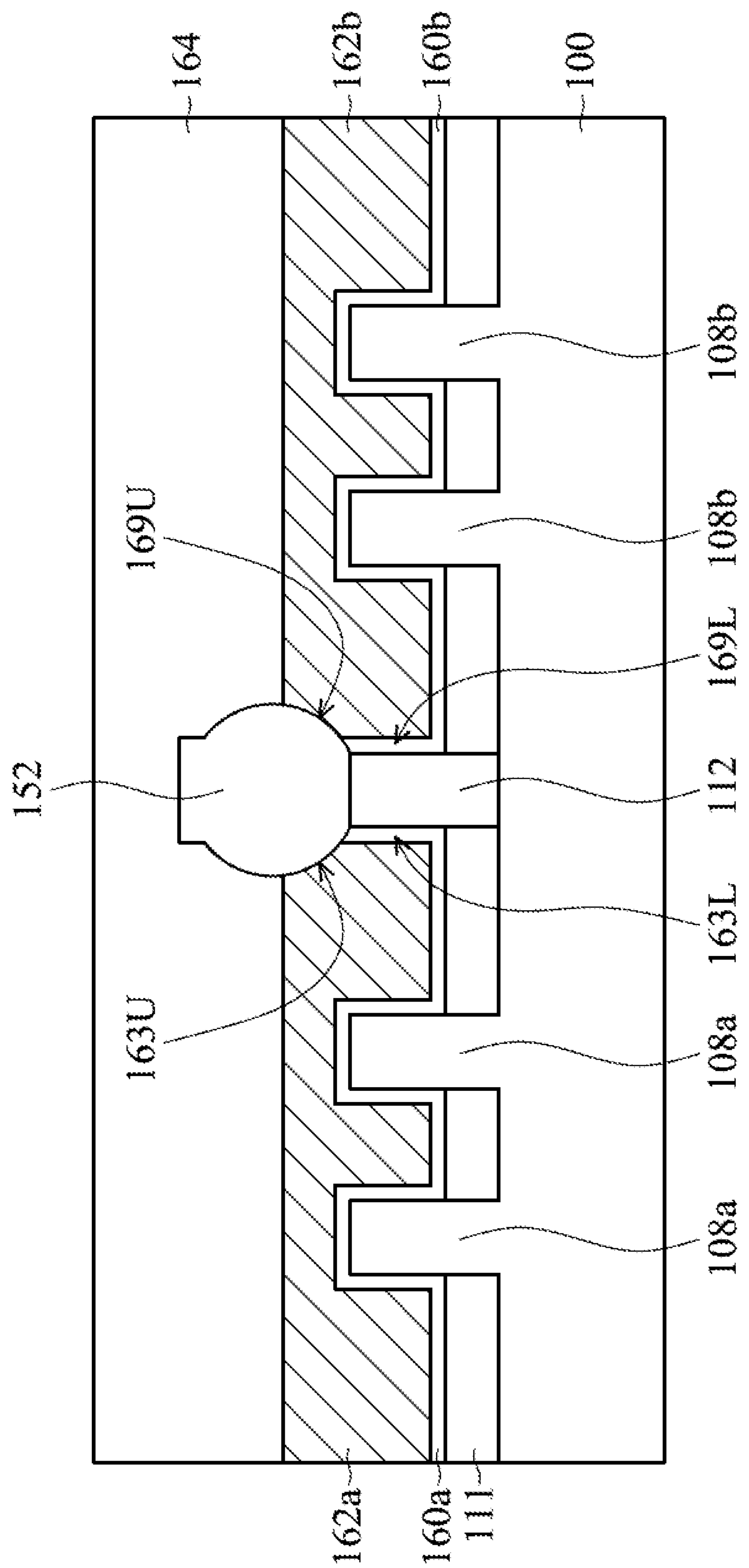
Figure 2H:
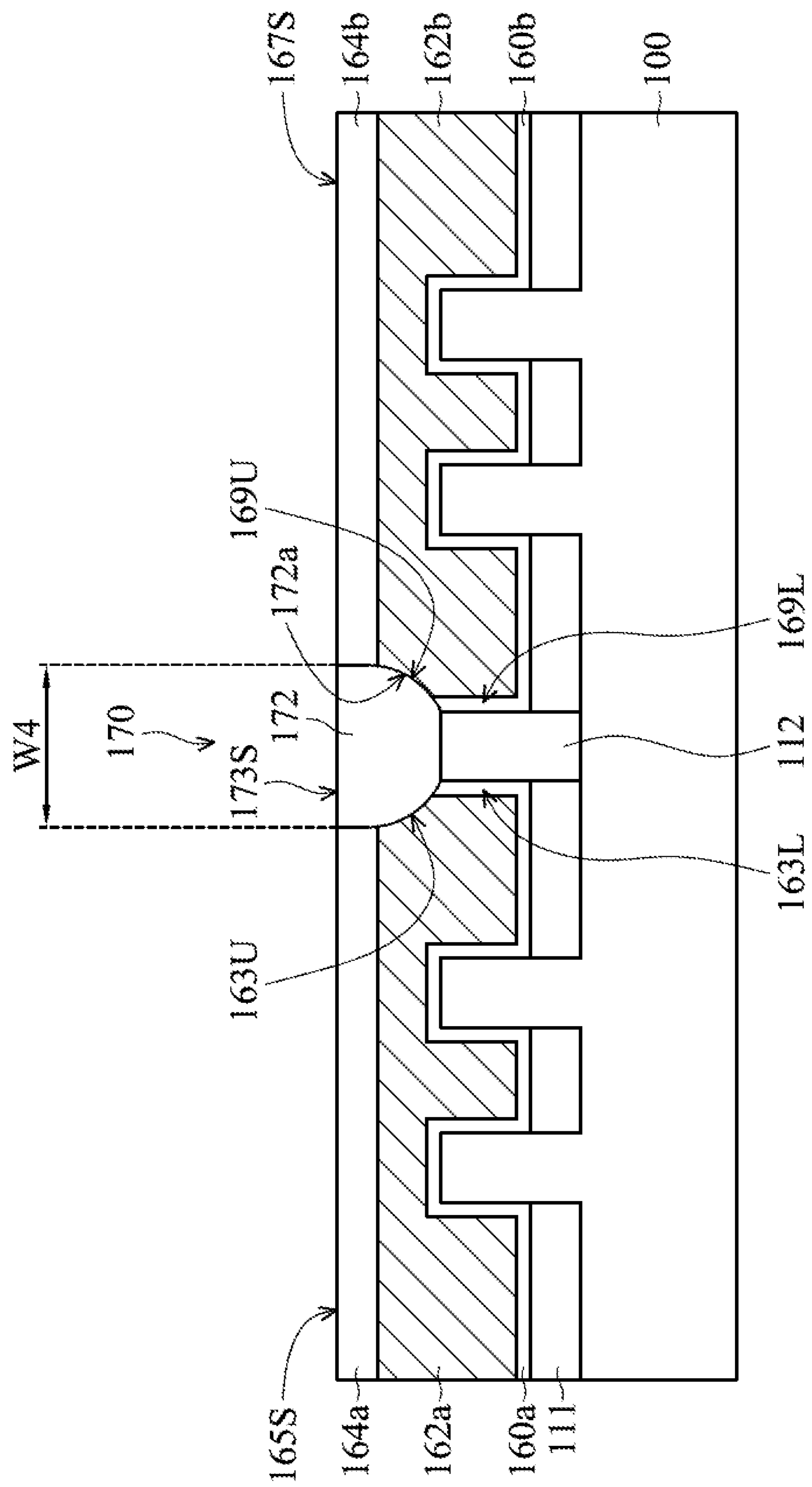

After the insulating layer 130 is formed, a masking layer 140 with an opening 141 is formed over the dummy gate structure and the insulating layer 130 (which is indicated by FIG. 2H), as shown in FIG. 2B in accordance with some embodiments. In some embodiments, the opening 141 is used for patterning the underlying dummy electrode layer 116, so as to cut the dummy gate structure in subsequent processes. Moreover, the top width W1 of the opening 141 is greater than the top width W3 of the insulating fin structure 112. In some embodiments, the masking layer 140 is made of silicon nitride, silicon carbon nitride, silicon oxynitride, or another applicable material. The masking layer 140 may be formed by a deposition process, such as a chemical vapor deposition (CVD) process, a low-pressure chemical vapor deposition (LPCVD) processes, a plasma enhanced chemical vapor deposition (PECVD) process, or another applicable process. After the masking layer 140 is formed, the opening 141 is formed by lithography and etching processes, in accordance with some embodiments. The formed opening 141 is formed directly above the insulating fin structure 112 and exposes a portion of the underlying dummy electrode layer 116 by a dry etching process, a wet etching process, or a combination thereof.

After the opening 141 is formed, a cut opening 146 is formed to cut the dummy gate structure, as shown in FIGS. 2C to 2D in accordance with some embodiments. More specifically, the cut opening 146 is formed by etching the dummy gate structure using the masking layer 140 as an etch mask, so that the insulating fin structure 112 is exposed through the cut opening 146. In some embodiments, a first portion of the first gate structure is removed by an anisotropic etch process 144 (e.g., a dry etching process), to form the upper portion of the cut opening 146 with substantially vertical sidewalls 146*a* (or sidewall surfaces), as shown in FIG. 2C. Therefore, the upper portion of the cut opening 146 has a top width that is substantially equal to the top width W1 of the opening 141 (which is indicated by FIG. 2B). In some embodiments, although there is not shown in FIG. 2C, the upper portion of the cut opening 146 with sidewalls 146*a* has a square or rectangular contour as viewed from top-view perspective.

Afterwards, a second portion of the first gate structure is removed by an isotropic etch process 148 (e.g., a wet etching process), to form the lower portion of the cut opening 146 that exposes a portion of the top surface 112S of the insulating fin structure 112, as shown in FIG. 2D. Unlike the upper portion of the cut opening 146, the lower portion of the cut opening 146 has convex sidewalls 146*b* (or sidewall surfaces). Therefore, the lower portion of the cut opening 146 has a top width that is substantially equal to the top width W1 of the opening 141 (which is indicated by FIG. 2B). Moreover, the lower portion of the cut opening 146 has a maximum width W2 (at the middle of the lower portion of the cut opening 146) that is greater than the top width W1 of the opening 141. In some embodiments, although there is not shown in FIG. 2D, the lower portion of the cut opening 146 with sidewalls 146*b* has a circular or oval contour as viewed from top-view perspective.

The cut opening 146 including sidewalls 146*a* and 146*b* divides the dummy gate dielectric layer 114 into two portions. Also, the cut opening 146 divides the dummy gate electrode layer 116 into two portions (as indicated by 116*a* and 116*b*). Since the cut opening 146 is formed in the dummy gate structure with the, the cut opening 146, as well as the gate spacer layers 118, the fin structures 108*a* and 108*b*, and the insulating fin structure 112, are formed in the insulating layer 130 (as indicated in FIG. 1H).

After the cut opening 146 is formed, the cut opening 146 is filled with an insulating layer 152, as shown in FIG. 2E in accordance with some embodiments. In some embodiments, an insulating material (not shown) is formed over the masking layer 140 and fully fills the cut opening 146. Afterwards, a planarization process, such as a chemical mechanical polish (CMP), is successively performed on the insulating material, the masking layer 140, and the two portions 116*a* and 116*b* of the dummy gate electrode layer 116 (which are also referred to as the first portion of the dummy gate electrode layer 116*a* and the second portion of the dummy gate electrode layer 116*b*). More specifically, in some embodiments, the excess insulating material above the cut opening 146 and the underlying masking layer 140 are fully removed after the planarization process, so that the first portion of the dummy gate electrode layer 116*a* and the second portion of the dummy gate electrode layer 116*b* are exposed. Moreover, during the planarization process, portions of the first portion of the dummy gate electrode layer 116*a* and the second portion of the dummy gate electrode layer 116*b*, a portion of insulating material in the cut opening 146, and a portion of the insulating layer 130 (as indicated in FIG. 1H) are removed. As a result, the remaining insulating material in the cut opening 146 forms the insulating layer 152 between the fin structures 108*a* and the fin structures 1008*b* and above the fin structures 108*a* and 108*b* and the insulating fin structure 112. Moreover, the top surface of the insulating layer 152 is substantially level with top surfaces of the first portion of the dummy gate electrode layer 116*a* and the second portion of the dummy gate electrode layer 116*b*, the gate spacer layers 118, and the insulating layer 130.

In some embodiments, the insulating layer 152 acts as another portion of the subsequently formed gate isolation structure. Moreover, the insulating layer 152 is in direct contact with the top surface 112S of the insulating fin structure 112, so that the insulating fin structure 112 is between the substrate 100 and the insulating layer 152. That is, the insulating fin structure 112 extends from the top surface of the substrate 100 to the bottom surface of the insulating layer 152.

Since the insulating layer 152 fully fills the cut opening 146, the insulating layer 152 has an upper portion with substantially vertical sidewalls 152*a* (or sidewall surfaces) and a lower portion with convex sidewalls 152*b* (or sidewall surfaces), as shown in FIG. 2E. Similarly, the upper portion of the insulating layer 152 has a top width that is substantially equal to the top width W1 of the opening 141 (which is indicated by FIG. 2B). Moreover, the lower portion of the insulating layer 152 has a top width that is substantially equal to the top width W1 and has a maximum width (at the middle of the lower portion of the insulating layer 152) that is substantially equal to the maximum width W2 (which is indicated by FIG. 2D). In some embodiments, although there is not shown in FIG. 2E, the upper portion of the insulating layer 152 with sidewalls 152*a* has a square or rectangular contour as viewed from top-view perspective and the lower portion of the insulating layer 152 with sidewalls 152*b* has a circular or oval contour as viewed from top-view perspective.

In some embodiments, the insulating layer 152 and the insulating fin structure 112. In some embodiments, the insulating layer 152 also has a top width that is substantially equal to the top width W1. The stack of the insulating layer 152 and the insulating fin structure 112 forms the insulating gate isolation structure 142 and is spaced apart from the fin structures 108*a* and 108*b*. In some embodiments, the insulating layer 152 is made of a material with high gapfill capability. For example, the insulating layer 152 may be made of a nitride-based material and/or an oxygen-free material. In some embodiments, the insulating layer 152 is made of silicon nitride and the insulating fin structure 112 is made of silicon carbon nitride. The insulating layer 152 may be formed by a deposition process, such as a chemical vapor deposition (CVD) process, a low-pressure chemical vapor deposition (LPCVD) processes, a plasma enhanced chemical vapor deposition (PECVD) process, or another applicable process.

In some embodiments, the insulating layer 152 is made of a nitride-based material, such as silicon nitride, silicon oxynitride, or silicon carbon nitride, or the like. In some embodiments, the insulating layer 152 is formed by chemical vapor deposition (CVD), physical vapor deposition, (PVD), or another applicable process.

After the insulating layer 152 is formed, the dummy gate structure including the dummy gate dielectric layer 114, the first portion of the dummy gate electrode layer 116*a* and the second portion of the dummy gate electrode layer 116*b* are replaced by an active gate structure, as shown in FIGS. 2F to 2H in accordance with some embodiments. As shown in FIG. 2F, the dummy gate structure is removed to form openings 155*a* and 155*b* (which are also referred to as gate openings) in the insulating layer 130 (which is indicated in FIG. 1H). More specifically, the dummy gate dielectric layer 114, the first portion of the dummy gate electrode layer 116*a* and the second portion of the dummy gate electrode layer 116*b* are removed by an etching process, such as a dry etching process or a wet etching process, in accordance with some embodiments. As a result, the gate openings 155*a* and 155*b* are separated by the insulating fin structure 112 and the insulating layer 152.

After the gate openings 155*a* and 155*b* are formed, an active gate structure is formed in each of the gate openings 155*a* and 155*b* (which are indicated by FIG. 2F), as shown in FIG. 2G in accordance with some embodiments. The active gate structure in the gate opening 155*a* is formed across the fin structures 108*a*. In some embodiments, the active gate structure in the gate opening 155*a* has a lower sidewall 163L (or lower sidewall surface) with a substantially vertical profile, and an upper sidewall 163U (or upper sidewall surface) with a concave profile. A portion of the insulating fin structure 112 extending above the isolation structure 111 adjoins to the lower sidewall 163L of the active gate structure in the gate opening 155*a*. A portion of the insulating layer 152 above the insulating fin structure 112 adjoins to the upper sidewall 163U of the active gate structure in the gate opening 155*a*. Similarly, the active gate structure in the gate opening 155*b* is formed across the fin structures 108*b*. In some embodiments, the active gate structure in the gate opening 155*b* has a lower sidewall 169L (or lower sidewall surface) with a substantially vertical profile, and an upper sidewall 169U (or upper sidewall surface) with a concave profile. The portion of the insulating fin structure 112 extending above the isolation structure 111 also adjoins to the lower sidewall 169L of the active gate structure in the gate opening 155*b*. The portion of the insulating layer 152 above the insulating fin structure 112 also adjoins to the upper sidewall 169U of the active gate structure in the gate opening 155*b*.

In some embodiments, the active gate structure in the gate opening 155*a* at least includes a gate dielectric layer 160*a* and a gate electrode layer 162*a* over the gate dielectric layer 160*a*. More specifically, the gate dielectric layer 160*a* is formed over the exposed fin structures 108*a*, the exposed isolation structures 111 in the gate opening 155*a*, and an exposed sidewall of the insulating fin structure 112 in the gate opening 155*a*. Also, the active gate structure in the gate opening 155*b* at least includes a gate dielectric layer 160*b* and a gate electrode layer 162*b* over the gate dielectric layer 160*b*. More specifically, the gate dielectric layer 160*b* is formed over the exposed fin structures 108*b*, the exposed isolation structures 111 in the gate opening 155*b*, and an exposed sidewall of the insulating fin structure 112 in the gate opening 155*b*.

In some embodiments, the gate dielectric layer 156 is made of a high k dielectric material, such as metal oxide. Examples of the high-k dielectric material may include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the gate dielectric layer 156 may be formed by chemical vapor deposition (CVD), physical vapor deposition, (PVD), atomic layer deposition (ALD), or another applicable process.

An interfacial layer (not shown) may be formed between the exposed portions of the fin structures 108*a* and 108*b* and the corresponding gate dielectric layers 160*a* and 160*b*, so that the adhesion of the gate dielectric layers 160*a* and 160*b* can be improved. In some embodiments, the interfacial layer is made of $SiO_2$. In some embodiments, the interfacial layer is formed by an atomic layer deposition (ALD) process, a thermal oxidation process, chemical vapor deposition (CVD) process, or another applicable process.

After the gate dielectric layers 160*a* and 160*b* are formed, a work functional metal layer (not shown) is formed over and conformally covers the inner surface of the gate opening 155*a* and the inner surface of the gate opening 155*b*, in accordance with some embodiments. The work function metal layer is tuned to have a proper work function.

In some embodiments, the work function metal layer is made of an N-type work-function metal or a P-type work-function metal. N-type work-function metals include titanium (Ti), aluminum (Al), titanium aluminum alloy (TiAl), titanium aluminum nitride (TiAlN), titanium aluminum carbide (TiAlC), tantalum carbide (TaC), tantalum carbon nitride (TaCN), and combinations thereof. The P-type work-function metal includes titanium nitride (TiN), tungsten nitride (WN), tantalum nitride (TaN), or a combination thereof. In some embodiments, the work function metal layer is formed by atomic layer deposition (ALD), sputtering, physical vapor deposition (PVD), or another applicable process.

After the work functional metal layer is formed, the gate electrode layer 162*a* is formed in the gate opening 155*a* to cover the work functional metal layer therein, in accordance with some embodiments. Also, the gate electrode layer 162*b* is formed in the gate opening 155*b* to cover the work functional metal layer therein. For example, the gate electrode layers 162*a* and 162*b* may be made of a metal material, such as tungsten (W). The gate electrode layers 162*a* and 162*b* may be formed by a depositing a metal material using, for example, chemical vapor deposition (CVD), high density plasma CVD (HDPCVD), metal organic CVD (MOCVD), plasma enhanced CVD (PECVD), or another applicable process. Afterwards, the metal material are recessed by etching, so as to form the gate electrode layers 162*a* and 162*b* as shown in FIG. 2G in accordance with some embodiments. After the etching, the top surface of the gate electrode layers 162*a* and 162*b* are lower than the top of the lower portion of the insulating layer 152. As a result, a portion of the insulating layer 152 protrudes above the gate electrode layers 162*a* and 162*b*.

After the gate electrode layers 162*a* and 162*b* is formed, an insulating capping layer 164 is formed to cover the gate electrode layers 162a and 162b and the insulating layer 152, as shown in FIG. 2G in accordance with some embodiments. The insulating capping layer 164 may protect the gate electrode layers 162a and 162b in the subsequent manufacturing processes (e.g., etching processes). In some embodiments, the gate electrode layers 162a and 162b is made of a nitride-based material, such as SiN, SiON, SiCN, or the like. The insulating capping layer 164 may be formed by chemical vapor deposition (CVD), physical vapor deposition, (PVD), or another applicable process.

Afterwards, a planarization process is performed on the structure shown in FIG. 2G, as shown in FIG. 2H in accordance with some embodiments. More specifically, the insulating capping layer 164 and the underlying insulating layer 152 are planarized by a polishing process, such as a chemical mechanical polishing (CMP) process, in accordance with some embodiments. As a result, the entire upper portion of the insulating layer 152 and a portion of the lower portion of the insulating layer 152 are removed during the polishing process, so as to form a bowl-shaped insulating layer 172 above the insulating fin structure 112 and the fin structures 108a and 180b.

In some embodiments, the bowl-shaped insulating layer 172 has opposing convex sidewalls 172a (or convex sidewall surfaces) adjacent to the upper sidewall 163U of the gate electrode layer 162a and the sidewall 169U of the gate electrode layer 162b, respectively. The bowl-shaped insulating layer 172 and the underlying insulating fin structure 112 form a gate isolation structure 170, in which a portion of the bowl-shaped insulating layer 172 protrudes above the gate electrode layer 162a and the gate electrode layer 162b. In some embodiments, the top width W4 of the bowl-shaped insulating layer 172 is greater than the top width W3 (which is indicated by FIG. 2B) of the insulating fin structure 112. In some embodiments, the top width W4 of the bowl-shaped insulating layer 172 can be controlled by the duration of the polishing process, so that the top width W4 of the bowl-shaped insulating layer 172 is substantially equal to the maximum width (e.g., the maximum width W2 indicated by FIG. 2D) of the lower portion of the insulating layer 152 has a top width that is greater than the top width of the insulating fin structure 112.

In some embodiments, a portion of the insulating capping layer 164 is removed while the entire upper portion of the insulating layer 152 and a portion of the lower portion of the insulating layer 152 are being polished, so as to form insulating capping layers 164a and 164b that are separated from each other by the bowl-shaped insulating layer 172. As shown in FIG. 2H, the insulating capping layer 164a covers the gate electrode layer 162a and the insulating capping layer 164b covers the gate electrode layer 162b. Moreover, after the polishing process, the top surface 165S of the capping layer 164a and the top surface 167S of the capping layer 164b are substantially level with the top surface 173S of the bowl-shaped insulating layer 172.

Embodiments of a semiconductor device structure and a method for forming the same are provided. The semiconductor device structure includes a first gate structure formed across a first fin structure and a second gate structure formed across a second fin structure. A gate isolation structure includes a bowl-shaped insulating layer formed between the first fin structure and the second fin structure, so as to separate and electrically isolate the first gate structure from the second gate structure. The gate isolation structure has two opposing convex sidewall surfaces adjacent to the first gate and second gate structures, respectively. Compared to a gate isolation structure with vertical sidewall surfaces, the bowl-shaped insulating layer (the gate isolation structure) provides a wider width between the first gate structure and second gate structure. As a result, such a gate isolation structure can be endurable to several etching processes used in the formation of the semiconductor device, thereby increasing the reliability of the gate isolation structure. Moreover, such a gate isolation structure also provides a wider gate-to-gate distance, thereby enhancing the isolation properties between the gate structures. As a result, the semiconductor devices on both sides of the gate isolation structure can have high breakdown voltage. Moreover, low leakage current between the semiconductor devices on both sides of the gate isolation structure can be obtained.

In some embodiments, a semiconductor device structure is provided. The semiconductor device structure includes an isolation structure formed over a semiconductor substrate. The semiconductor device structure also includes a first fin structure and a second fin structure extending from the semiconductor substrate and protruding above the isolation structure. The semiconductor device structure further includes a first gate structure formed across the first fin structure and a second gate structure formed across the second fin structure. In addition, the semiconductor device structure also includes a gate isolation structure formed between the first fin structure and the second fin structure and separating the first gate structure from the second gate structure. The gate isolation structure includes a bowl-shaped insulating layer that has a first convex sidewall surface adjacent to the first gate structure and a second convex sidewall surface adjacent to the second gate structure.

In some embodiments, a semiconductor device structure is provided. The semiconductor device structure includes an isolation structure formed over a semiconductor substrate. The semiconductor device structure also includes a fin structure extending from the semiconductor substrate and protruding above the isolation structure and a gate structure formed across the fin structure. The gate structure has a lower sidewall with a substantially vertical profile, and an upper sidewall with a concave profile. The semiconductor device structure further includes an insulating fin structure formed over the semiconductor substrate. A portion of the insulating fin structure extends above the isolation structure and adjoins to the lower sidewall of the gate structure. In addition, the semiconductor device structure includes an insulating layer formed over the insulating fin structure and adjoining the upper sidewall of the gate structure, so that the insulating layer has a convex sidewall.

In some embodiments, a method of forming a semiconductor device structure is provided. The method includes forming an isolation structure over a semiconductor substrate. The semiconductor substrate includes a fin structure protruding above the isolation structure. The method also includes forming an insulating fin structure over the semiconductor substrate and protruding above the isolation structure. The method further includes forming a first gate structure over the isolation structure and across the fin structure and the insulating fin structure. In addition, the method includes forming an opening in the first gate structure to expose a top surface of the insulating fin structure and divide the first gate structure into two portions. The opening includes an upper portion with substantially vertical sidewalls and a lower portion with convex sidewalls. The method also includes filling the opening with an insulating layer and replacing the first gate structure with a second gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:

an isolation structure formed over a semiconductor substrate;

a first fin structure and a second fin structure extending from the semiconductor substrate and protruding above the isolation structure;

a first gate structure formed across the first fin structure and a second gate structure formed across the second fin structure; and a gate isolation structure formed between the first fin structure and the second fin structure and separating the first gate structure from the second gate structure, wherein the gate isolation structure comprises:

a bowl-shaped insulating layer having a first sidewall surface adjacent to the first gate structure and a second sidewall surface adjacent to the second gate structure, wherein a top width of the bowl-shaped insulating layer is a maximum width of the gate isolation structure, and wherein an interface between the first sidewall surface and the first gate structure and an interface between the second sidewall surface and the second gate structure each have a convex contour as viewed from a side-view perspective.

2. The semiconductor device structure as claimed in claim 1, wherein the bowl-shaped insulating layer is formed above the first fin structure and the second fin structure.

3. The semiconductor device structure as claimed in claim 1, wherein the gate isolation structure further comprises:

an insulating fin structure extending from a top surface of the semiconductor substrate to a bottom surface of the bowl-shaped insulating layer.

4. The semiconductor device structure as claimed in claim 3, wherein a top width of the bowl-shaped insulating layer is greater than a top width of the insulating fin structure.

5. The semiconductor device structure as claimed in claim 3, wherein the bowl-shaped insulating layer and the insulating fin structure comprise a nitride-based material.

6. The semiconductor device structure as claimed in claim 3, wherein the bowl-shaped insulating layer comprises an oxygen-free material.

7. The semiconductor device structure as claimed in claim 1, further comprising:

a first insulating capping layer covering the first gate structure and a second insulating capping layer covering the second gate structure, wherein top surfaces of the first and second insulating capping layers are substantially level with a top surface of the bowl-shaped insulating layer.

8. A semiconductor device structure, comprising:

an isolation structure formed over a semiconductor substrate;

a fin structure extending from the semiconductor substrate and protruding above the isolation structure;

a gate structure formed across the fin structure, wherein the gate structure has a lower sidewall with a substantially vertical profile, and an upper sidewall with a concave profile, as viewed from a side-view perspective;

an insulating fin structure formed over the semiconductor substrate and passing through the isolation structure, wherein a portion of the insulating fin structure extends above the isolation structure and adjoins the lower sidewall of the gate structure; and an insulating layer formed over the insulating fin structure and adjoining the upper sidewall of the gate structure, so that the insulating layer has a convex sidewall.

9. The semiconductor device structure as claimed in claim 8, wherein a portion of the insulating layer protrudes above the gate structure.

10. The semiconductor device structure as claimed in claim 8, wherein a top width of the insulating layer is greater than a top width of the insulating fin structure.

11. The semiconductor device structure as claimed in claim 8, wherein the insulating layer comprises silicon nitride and the insulating fin structure comprises silicon carbon nitride.

12. The semiconductor device structure as claimed in claim 8, further comprising:

a capping layer covering the gate structure, wherein a top surface of the capping layer is substantially level with a top surface of the insulating layer.

13. The semiconductor device structure as claimed in claim 12, wherein the capping layer comprises a nitride-based material.

14. The semiconductor device structure as claimed in claim 8, further comprising:

a second insulating layer formed over the isolation structure, wherein the fin structure, the gate structure, the insulating fin structure, and the insulating layer are formed in the second insulating layer.

15. A semiconductor device structure, comprising:

a first gate structure and a second gate structure formed over a semiconductor substrate and arranged side by side; and a gate isolation structure formed adjacent to a first sidewall of the first gate structure and a second sidewall of the second gate structure, wherein the gate isolation structure comprises:

a first insulating layer between a lower portion of the first sidewall and a lower portion of the second sidewall and extending into the semiconductor substrate; and a second insulating layer extending from a top of the first insulating layer and between an upper portion of the first sidewall and an upper portion of the second sidewall, wherein a distance from a top corner at a top of the first sidewall to a top corner at a top of the second sidewall is greater than a distance from a bottom corner at a bottom of the first sidewall to a bottom corner at a bottom of the second sidewall, and wherein the bottom corners at the bottoms of the first sidewall and the second sidewall are below the top of the first insulating layer, wherein the second insulating layer has a third sidewall and a fourth sidewall opposite to the third sidewall, and wherein an interface between the third sidewall and the upper portion of the first sidewall and an interface between the fourth sidewall and the upper portion of the second sidewall have a substantially convex profile with respect to the second insulating layer as viewed from a side-view perspective.

16. The semiconductor device structure as claimed in claim 15, further comprising:

a first insulating capping layer formed over the first gate structure; and a second insulating capping layer formed over the second gate structure, wherein the first insulating layer and the second insulating capping layer are formed adjacent to the second insulating layer.

17. The semiconductor device structure as claimed in claim 15, wherein the first insulating layer has a fifth sidewall and a sixth sidewall opposite to the fifth sidewall, and wherein an interface between the third-fifth sidewall and the lower portion of the first sidewall and an interface between the fourth sixth sidewall and the lower portion of the second sidewall have a substantially vertical profile.

18. The semiconductor device structure as claimed in claim 15, wherein a top width of the second insulating layer is greater than a bottom width of the second insulating layer.

19. The semiconductor device structure as claimed in claim 18, wherein the bottom width of the second insulating layer is substantially equal to a top width of the first insulating layer.

20. The semiconductor device structure as claimed in claim 15, further comprising an isolation structure below the first gate structure and the second gate structure, wherein a bottom surface of the isolation structure is substantially level with a bottom surface of the second insulating layer.

* * * * *